United States Patent [19]
Osipov et al.

[11] 3,941,292
[45] Mar. 2, 1976

[54] APPARATUS FOR SOLDERING A PLURALITY OF FLAT CONDUCTORS ON A BOARD

[76] Inventors: Anatoly Alexandrovich Osipov, proezd Kadomtseva, 7, kv. 26; Nikolai Semenovich Pekov, ulitsa B. Mariinskaya, 2, kv. 77; Petr Pavlovich Semenov, Leninsky prospekt, 91, kv. 69, all of Moscow, U.S.S.R.

[22] Filed: June 6, 1974

[21] Appl. No.: 477,062

[52] U.S. Cl. .................. 228/35; 228/179; 228/256; 228/52
[51] Int. Cl.² .. B23K 1/12; B23K 3/02; B23K 37/06
[58] Field of Search ............. 228/22, 35, 19, 33, 25, 228/4, 6, 52, 54, 179, 256; 29/503, 624, 625

[56] References Cited
UNITED STATES PATENTS

| | | |
|---|---|---|
| 2,450,860 | 10/1948 | Proffit.................................. 228/19 |
| 3,529,760 | 9/1970 | Hickman et al. ..................... 228/52 |

*Primary Examiner*—Francis S. Husar
*Assistant Examiner*—Gus T. Hampilos
*Attorney, Agent, or Firm*—Haseltine, Lake & Waters

[57] ABSTRACT

An apparatus for soldering a plurality of flat conductors on a board consisting of a head with a soldering element and of a mechanism for relative displacement of the board and head. The soldering element has a working surface unwetted by the solder wherein, according to the invention, there is incorporated an elongated portion wetted by the solder and disposed at an angle to the line of relative displacement of the board and head. Said portion serves to spread the solder over each lead while being moved at a constant rate from lead to lead in succession.

3 Claims, 4 Drawing Figures

U.S. Patent   March 2, 1976   3,941,292
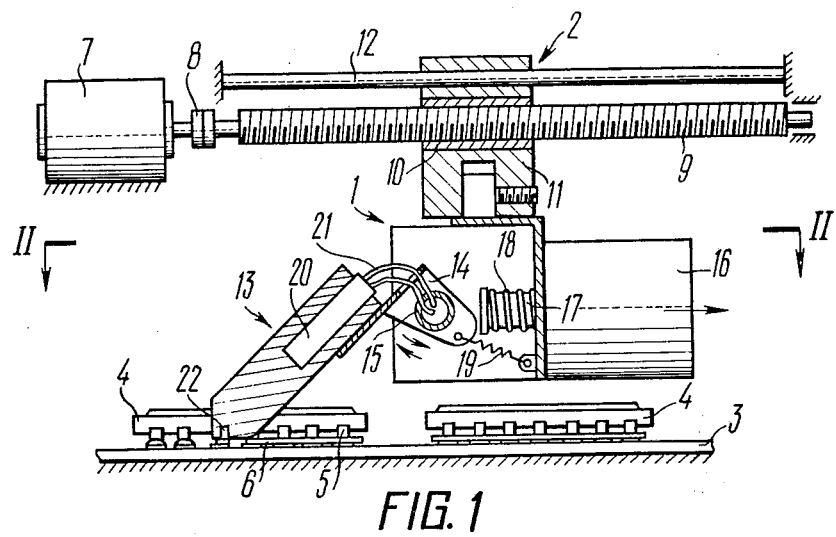
FIG. 1
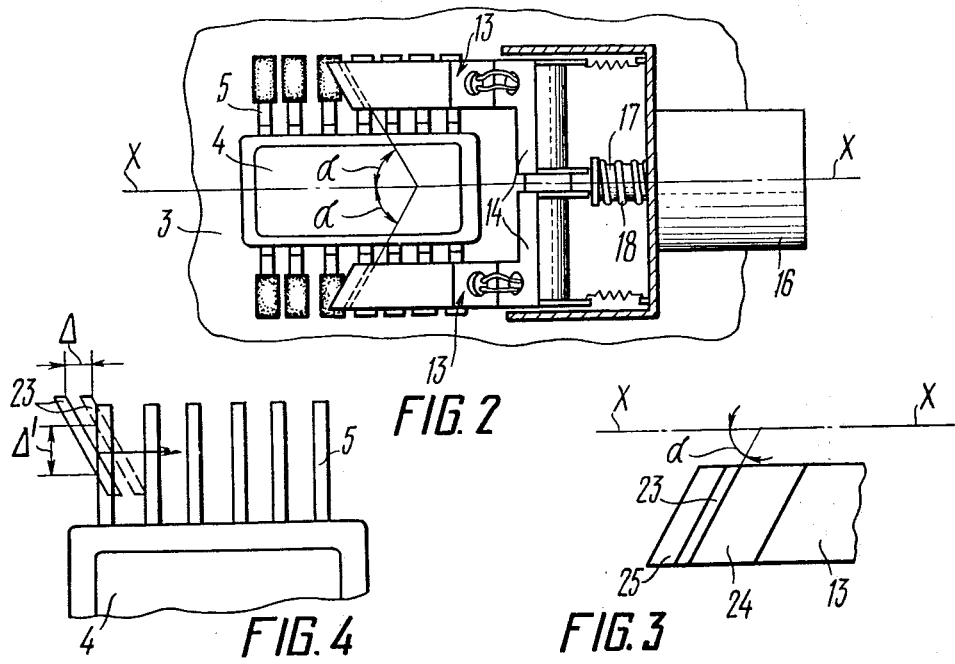
FIG. 2
FIG. 4
FIG. 3

APPARATUS FOR SOLDERING A PLURALITY OF FLAT CONDUCTORS ON A BOARD

The present invention relates to methods for fabricating electronic equipment, and more specifically to apparatus for soldering a plurality of flat conductors, leads of integrated microcircuits in particular, on a board.

There are known apparatus for soldering a plurality of flat conductors, leads of integrated microcircuits in particular, on a board, comprising a head with a soldering element containing a working surface unwetted by the solder and a mechanism for relative displacement of the board and head.

Yet, the known apparatus fail to assure quality soldering because their soldering elements, unwetted by the solder, are made of or clad with materials such as molibdenum, tungsten, nickel-chromium-iron alloy, tantal and other which display poor thermal conductivity and low specific heat. To provide the requisite amount of heat to the joints, these soldering elements must be heated to a temperature by far exceeding the melting point of the solder with the result that burning and spattering of both flux and solder take place and pores as well as blowholes are likely to occur in soldered joints. Materials exhibiting good heat transfer as copper and copper-based alloys are wetted with the solder at the temperature employed in soldering and their use as soldering elements in the known apparatus brings about the formation of intolerable accumulations of solder and bridges between adjacent leads when the soldering element is being separated from the joint.

Another significant disadvantage of the known soldering apparatus is low rate of work and sophisticated design which is overcome by moving descretely the board with microcircuits (or head), aligning the leads in succession with the soldering element, separating and lowering this each time a lead has been soldered. The use of soldering elements with the working surface extended so as to heat more than one lead at a time gives an increase in the rate of work but introduces the danger of damaging microcircuits by a thermal shock (this is avoided by employing special heat dissipators and cooling the zone of soldering in an inert gas) and fails to assure a uniform rate of heat transfer from the soldering element to each of the leads separately.

It is an object of the present invention to provide an apparatus for soldering which is free from said disadvantages.

The primary object of the present invention is to provide an apparatus for soldering a plurality of flat conductors on a board which is simple in design and assures the possibility of soldering each lead separately while the head or board are being moved without stopping.

This object is attained by the fact that in the apparatus for soldering a plurality of flat conductors which comprises a head with a soldering element incorporating a working surface in direct contact with the conductors soldered and a mechanism for the relative displacement of the board and head there is on the working surface according to the invention an elongated portion wetted by the solder, disposed at an angle to the line of travel of the head relatively to the board and serving to spread the solder over each lead while being moved at a constant rate from lead to lead in succession.

It is expedient that the portion wetted by the solder is interposed according to the invention between the portions unwetted by the solder.

It is also expedient that the portion wetted by the solder is given according to the invention the form of a removable insert disposed in a groove of the soldering element.

The use of the apparatus for soldering disclosed is conducive to a high rate of work while soldering a plurality of flat conductors on a board because the soldering can be done while the head is being moved relatively to the board without stopping.

Moreover, the presence of an elongated portion wetted by the solder in the working surface of soldering element provides for a constant rate of heat transfer from the soldering element to each of the conductors separately and the fact that said elongated portion is disposed at an angle to the line of travel of the head relatively to the board and also between the portions sunwetted by the solder provides for the possibility of controlling the process of spreading the solder while soldering.

The present invention will be best understood from the following detailed description of the preferred embodiment of the invention when this is being read in conjunction with the accompanying drawings in which FIG. 1 is a schematic general view of the apparatus for soldering according to the invention (the actuating mechanism and soldering element are shown in sectional elevation);

FIG. 2 is a section on line II—II of FIG. 1;

FIG. 3 is a soldering element according to the invention viewed from the working surface;

FIG. 4 is a schematic diagram illustrating the position of that portion of the working surface of soldering element which is wetted by the solder according to the invention with respect to leads of a microcircuit at two stages of the process of soldering.

Referring to FIG. 1, the apparatus for soldering leads of integrated microcircuits disclosed consists of a head 1 secured to a mechanism 2 serving to move same with respect to a board 3 which in the preferred embodiment is installed immovably. It goes without saving that the board 3 can be moved, using any of the known means, with respect to the head 1.

Disposed on the board 3 are microcircuits 4 with flat leads 5 given a coat of a hardened solder 6 in advance.

The mechanism 2 for moving the head 1 incorporates an electric motor 7 linked up with a drive screw 9 by means of a coupling 8. Said screw engages a nut 10 of a slider 11 fitted to an immovable guide rail 12.

The head 1 is provided with a pair of soldering elements 13 (FIG. 2) embracing each microcircuit 4 at the two opposite sides where the leads 5 are disposed. The soldering elements 13 are attached to levers 14 which are free to pivot in a vertical plane about a tubular fulcrum pin 15 (FIG. 1) as indicated by the arrows. In certain cases it is expedient to provide the apparatus with only one soldering element. The pivotal movement of levers is controlled with the aid of an electromagnet 16 whose armature 17 is abutting against a spring 18 and interacts with an arm of each of the levers 14. The levers 14 are exposed to a pulling action exerted by springs 19. Rigidly attached to the opposite arms of each lever 14 there are soldering elements 13.

Each soldering element is a rod of rectilinear cross-section heated by an internally arranged electric heater 20 connected to a source of power (not shown) by wires 21. The material of rods is copper coated with a metal unwetted by the solder (chromium for example) and each rod has a working surface, i.e., one coming into contact with the soldered leads 5 and given the form of a parallelogram (FIG. 3). Disposed at an angle $\alpha$ to line $x$—$x$, which is that of relative displacement of the head 1 (FIG. 1) and board 3, there is in the working surface of each soldering element a groove accomodating a removable insert 22 also in copper but without a coat. Arranged flush with the working surface of each soldering element 13, each insert 22 forms therein an elongated portion 23 (FIG. 3) wetted by the solder and interposed between portions 24 and 25 unwetted by the solder. Said wetted portion is shown by broken lines in FIG. 2. The width of the insert 22 and the angle $\alpha$ are selected depending on the width of the soldered leads 5 and the spacing thereof.

The apparatus for soldering operates in the following way. The board 2 (FIGS. 1 and 2) with microcircuits 4 is secured that the leads 5 are located under the soldering elements 13 of the head 1. Preparatory to soldering, the soldering elements are heated up to the temperature recommended for the soldering of the joints. The electromagnet 16 and electric motor 7 are cut in simultaneously. At this instant the head 1 starts moving at a constant rate along the microcircuits 4 while the armature 17 of the electromagnet 16 sets the levers 14 free. The soldering elements 13 come down on the leads 5 with their working surfaces due to gravity and the action of the springs 19. As the head 1 progresses along its path, the successive portions 24, 23 and 25 (FIG. 3) of the working surfaces of the soldering elements 13 come into contact one after another with the leads 5, assuring at first the heating of the solder 6 (this is the function of the portions 24) and then a rapid melting of the solder through a coat of tin available within the portions 23. Since the portions 23 wetted by the solder are disposed at an angle $\alpha$ to line $x$—$x$ which is one of relative displacement of the head 1 and board 3, the contact between said portions and each of the successive leads 5 shifts gradually while soldering along the lead, assuring a forcible spreading of the solder in the same direction. For example, a travel of the soldering element by an amount $\Delta$ (FIG. 4) brings about a displacement of the contact by an amount $\Delta'$. A further travel of the head 1 interrupts the flow of liquid solder between the lead 5 and wetted portion 23 (the unwetted portion 25 intervenes at this stage) and the soldering elements 13 (FIG. 1) come into contact with the next lead 5.

Upon completing the soldering of the leads 5 of the last microcircuit 4, the electric motor 7 is cut out manually or automatically, the armature 17 of the electromagnet 16 is returned back into its original position due to the action of the spring 18 and, coming abutting against the levers 14, causes the soldering elements 13 to lift clear of the board 3.

Operating in this way, the disclosed apparatus for soldering assures local and successive heating of the joints while the head is being moved without stopping with the result that the rate of work is considerably increased (up to 1,500 microcircuits per hour) and so is the quality of soldering.

A combination in the apparatus disclosed of the advantages offered by soldering elements wetted and unwetted by the solder enables the optimization of the thermal cycle of soldering and high reproducibility of the shape of soldered joints.

The apparatus disclosed is also characterized by a high operational reliability and ease of operation, being free from units of sophisticated design.

What is claimed is:

1. Apparatus for soldering on a board a plurality of flat conductors and leads of integrated microcircuits in particular, comprising: a head, a soldering element connected to said head, means for displacing said head relative to said board, said soldering element having a working surface including a portion unwetted by the solder and an elongated portion wetted by the solder, said elongated portion wetted by said solder being bordered on two sides by said unwetted portion, means for heating said soldering element and spaced from said portions, said elongated portion having a longitudinal axis disposed at an angle to the direction of relative displacement of said head and said board, said elongated portion spreading solder over each lead while being moved by said head at constant rate from lead to lead in succession.

2. An apparatus as claimed in claim 1 wherein said portion wetted by the solder comprises a removable insert, said soldering element having a groove in said working surface for holding said removable insert.

3. Apparatus for soldering a plurality of flat conductors and leads of integrated microcircuits in particular, comprising: a head with an electromagnet; a movable lever with two arms, one of said arms being connected to said electromagnet; a soldering element rigidly attached to the other one of said arms of said lever; means for relative displacement of said board and said head consisting of an electric motor, a coupling, a drive screw linked to said electric motor through said coupling, a nut engaging said drive screw, a slider with said nut rigidly attached thereto, an immovable guide rail with said slider moving therealong, said head being rigidly attached to said slider; said soldering elements of said head having a working surface including a portion unwetted by the solder and an elongated portion wetted by the solder, said elongated portion wetted by said solder being bordered on two sides by said unwetted portion, means for heating said soldering element and spaced from said portions, said elongated portion having a longitudinal axis disposed at an angle to the direction of relative displacement of said board and said head, said elongated portion spreading the solder along each lead when said soldering element is being moved by said head at a constant rate from lead to lead in succession.

* * * * *